US008976566B2

(12) United States Patent
Ramaswamy et al.

(10) Patent No.: US 8,976,566 B2
(45) Date of Patent: *Mar. 10, 2015

(54) ELECTRONIC DEVICES, MEMORY DEVICES AND MEMORY ARRAYS

(71) Applicant: Micron Technology, Inc., Boise, ID (US)

(72) Inventors: D. V. Nirmal Ramaswamy, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 230 days.

This patent is subject to a terminal disclaimer.

(21) Appl. No.: 13/710,785

(22) Filed: Dec. 11, 2012

(65) Prior Publication Data

US 2013/0099192 A1    Apr. 25, 2013

Related U.S. Application Data

(63) Continuation of application No. 12/893,992, filed on Sep. 29, 2010, now Pat. No. 8,351,242.

(51) Int. Cl.
*G11C 11/00* (2006.01)
*G11C 11/34* (2006.01)
*H01L 27/105* (2006.01)
(Continued)

(52) U.S. Cl.
CPC .............. *H01L 45/14* (2013.01); *H01L 45/085* (2013.01); *H01L 45/1233* (2013.01); *H01L 45/1266* (2013.01); *H01L 45/142* (2013.01); *H01L 45/143* (2013.01); *H01L 45/144* (2013.01);
(Continued)

(58) Field of Classification Search
USPC ....................................... 365/148, 150; 257/4
See application file for complete search history.

(56) References Cited

U.S. PATENT DOCUMENTS 4,715,685 A    12/1987    Yaniv et al.
4,964,080 A    10/1990    Tzeng
(Continued)

FOREIGN PATENT DOCUMENTS

CN    1444284    9/2003
CN    1459792    12/2003
(Continued)

OTHER PUBLICATIONS

Kozicki et al., "Non-Volatile Memory Based on Solid Electrolytes", Non-Volatile Memory Technology Symposium, Nov. 15-17, 2004, pp. 10-17.
(Continued)

*Primary Examiner* — Evan Pert
(74) *Attorney, Agent, or Firm* — Wells St. John P.S.

(57) ABSTRACT

Some embodiments include electronic devices having two capacitors connected in series. The two capacitors share a common electrode. One of the capacitors includes a region of a semiconductor substrate and a dielectric between such region and the common electrode. The other of the capacitors includes a second electrode and ion conductive material between the second electrode and the common electrode. At least one of the first and second electrodes has an electrochemically active surface directly against the ion conductive material. Some embodiments include memory cells having two capacitors connected in series, and some embodiments include memory arrays containing such memory cells.

12 Claims, 4 Drawing Sheets

(51) Int. Cl.
*H01L 45/00* (2006.01)
*H01L 27/24* (2006.01)

(52) U.S. Cl.
CPC .......... *H01L 45/146* (2013.01); *H01L 27/2409*
(2013.01); *H01L 27/2463* (2013.01)
USPC .............................. 365/148; 365/150; 257/4

(56) References Cited

U.S. PATENT DOCUMENTS

| | | |
|---|---|---|
| 5,049,970 A | 9/1991 | Tanaka et al. |
| 5,122,476 A | 6/1992 | Fazan et al. |
| 6,218,696 B1 | 4/2001 | Radius |
| 6,432,767 B2 | 8/2002 | Torii et al. |
| 6,524,867 B2 | 2/2003 | Yang et al. |
| 6,552,952 B2 | 4/2003 | Pascucci |
| 6,687,147 B2 | 2/2004 | Frickie et al. |
| 6,693,821 B2 | 2/2004 | Hsu et al. |
| 6,693,846 B2 | 2/2004 | Fibranz |
| 6,717,881 B2 | 4/2004 | Ooishi |
| 6,753,561 B1 | 6/2004 | Rinerson et al. |
| 6,753,562 B1 | 6/2004 | Hsu et al. |
| 6,757,188 B2 | 6/2004 | Perner et al. |
| 6,778,421 B2 | 8/2004 | Tran |
| 6,785,159 B2 | 8/2004 | Tuttle |
| 6,806,531 B1 | 10/2004 | Chen et al. |
| 6,834,008 B2 | 12/2004 | Rinerson et al. |
| 6,873,544 B2 | 3/2005 | Perner et al. |
| 6,905,937 B2 | 6/2005 | Hsu et al. |
| 6,930,324 B2 | 8/2005 | Kowalski et al. |
| 6,940,113 B2 | 9/2005 | Hsu et al. |
| 6,946,702 B2 | 9/2005 | Jang |
| 6,950,369 B2 | 9/2005 | Kunikiyo et al. |
| 6,955,992 B2 | 10/2005 | Zhang et al. |
| 6,958,273 B2 | 10/2005 | Chen et al. |
| 6,970,375 B2 | 11/2005 | Rinerson et al. |
| 6,972,211 B2 | 12/2005 | Hsu et al. |
| 6,985,374 B2 | 1/2006 | Yamamura |
| 7,002,197 B2 | 2/2006 | Perner et al. |
| 7,005,350 B2 | 2/2006 | Walker et al. |
| 7,026,911 B2 | 4/2006 | Aono et al. |
| 7,029,924 B2 | 4/2006 | Hsu et al. |
| 7,029,925 B2 | 4/2006 | Celii et al. |
| 7,035,141 B1 | 4/2006 | Trispas et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,109,544 B2 | 9/2006 | Schoelesser et al. |
| 7,123,535 B2 | 10/2006 | Kurotsuchi et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,393,785 B2 | 7/2008 | Uhlenbrock et al. |
| 7,405,967 B2 | 7/2008 | Kozicki et al. |
| 7,465,675 B2 | 12/2008 | Koh |
| 7,473,982 B2 | 1/2009 | Aono et al. |
| 7,489,552 B2 | 2/2009 | Kurotsichi et al. |
| 7,525,410 B2 | 4/2009 | Aono et al. |
| 7,538,338 B2 | 5/2009 | Rinerson et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,639,523 B2 | 12/2009 | Celinska et al. |
| 7,671,417 B2 | 3/2010 | Yoshida et al. |
| 7,679,812 B2 | 3/2010 | Sasagawa et al. |
| 7,687,793 B2 | 3/2010 | Harshfield et al. |
| 7,687,840 B2 | 3/2010 | Shinmura |
| 7,696,077 B2 | 4/2010 | Liu |
| 7,700,935 B2 | 4/2010 | Kim et al. |
| 7,727,908 B2 | 6/2010 | Ahn et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 7,838,861 B2 | 11/2010 | Klostermann |
| 7,842,991 B2 | 11/2010 | Cho et al. |
| 7,864,568 B2 | 1/2011 | Fujisaki et al. |
| 7,898,839 B2 | 3/2011 | Aoki |
| 7,907,436 B2 | 3/2011 | Maejima et al. |
| 7,910,909 B2 | 3/2011 | Kim et al. |
| 7,948,784 B2 | 5/2011 | Kajigaya |
| 7,990,754 B2 | 8/2011 | Azuma et al. |
| 8,021,897 B2 | 9/2011 | Sills et al. |
| 8,043,926 B2 | 10/2011 | Cho et al. |
| 8,048,755 B2 | 11/2011 | Sandhu et al. |
| 8,094,477 B2 | 1/2012 | Maejima |
| 8,098,520 B2 | 1/2012 | Seigler et al. |
| 8,106,375 B2 | 1/2012 | Chen et al. |
| 8,114,468 B2 | 2/2012 | Sandhu et al. |
| 8,124,968 B2 | 2/2012 | Koo et al. |
| 8,154,908 B2 | 4/2012 | Maejima et al. |
| 8,154,909 B2 | 4/2012 | Azuma et al. |
| 8,295,077 B2 | 10/2012 | Murooka |
| 8,411,477 B2 | 4/2013 | Tang et al. |
| 8,431,458 B2 | 4/2013 | Sills et al. |
| 8,536,556 B2 | 9/2013 | Fukumizu |
| 8,537,592 B2 | 9/2013 | Liu |
| 8,542,513 B2 | 9/2013 | Tang et al. |
| 8,611,121 B2 | 12/2013 | Ahn et al. |
| 8,652,909 B2 | 2/2014 | Sills et al. |
| 2002/0018355 A1 | 2/2002 | Johnson et al. |
| 2002/0034117 A1 | 3/2002 | Okazawa |
| 2002/0079524 A1 | 6/2002 | Dennison et al. |
| 2002/0196695 A1 | 12/2002 | Pascucci |
| 2003/0031047 A1 | 2/2003 | Anthony et al. |
| 2003/0174042 A1 | 9/2003 | Aono et al. |
| 2003/0174570 A1 | 9/2003 | Ooishi |
| 2003/0218902 A1 | 11/2003 | Perner et al. |
| 2003/0218929 A1 | 11/2003 | Fibranz |
| 2003/0223283 A1 | 12/2003 | Kunikiyo |
| 2004/0002186 A1 | 1/2004 | Vyvoda et al. |
| 2004/0090841 A1 | 5/2004 | Perner et al. |
| 2004/0100835 A1 | 5/2004 | Sugibayashi et al. |
| 2004/0108528 A1 | 6/2004 | Hsu et al. |
| 2004/0124407 A1 | 7/2004 | Kozicki et al. |
| 2004/0188714 A1 | 9/2004 | Scheuerlein |
| 2004/0245547 A1 | 12/2004 | Stipe |
| 2005/0001257 A1 | 1/2005 | Schoelesser et al. |
| 2005/0014325 A1 | 1/2005 | Aono et al. |
| 2005/0032100 A1 | 2/2005 | Heath et al. |
| 2005/0054119 A1 | 3/2005 | Hsu et al. |
| 2005/0128799 A1 | 6/2005 | Kurotsuchi et al. |
| 2005/0161747 A1 | 7/2005 | Lung et al. |
| 2005/0205943 A1 | 9/2005 | Yamada |
| 2005/0243844 A1 | 11/2005 | Aono et al. |
| 2005/0250281 A1 | 11/2005 | Ufert et al. |
| 2005/0269646 A1 | 12/2005 | Yamada |
| 2005/0275003 A1 | 12/2005 | Shinmura |
| 2005/0287741 A1 | 12/2005 | Ding |
| 2006/0035451 A1 | 2/2006 | Hsu |
| 2006/0046509 A1 | 3/2006 | Gwan-Hyeob |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0104111 A1 | 5/2006 | Tripsas et al. |
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0215445 A1 | 9/2006 | Baek et al. |
| 2006/0258079 A1 | 11/2006 | Lung et al. |
| 2006/0274593 A1 | 12/2006 | Kurotsuchi et al. |
| 2006/0284242 A1 | 12/2006 | Jo |
| 2006/0286709 A1 | 12/2006 | Lung et al. |

(56) References Cited

U.S. PATENT DOCUMENTS

| | | |
|---|---|---|
| 2007/0010082 A1 | 1/2007 | Pinnow et al. |
| 2007/0015330 A1 | 1/2007 | Li et al. |
| 2007/0019923 A1 | 1/2007 | Sasagawa et al. |
| 2007/0041235 A1 | 2/2007 | Inoue |
| 2007/0045615 A1 | 3/2007 | Cho et al. |
| 2007/0048990 A1 | 3/2007 | Zhuang et al. |
| 2007/0086235 A1 | 4/2007 | Kim et al. |
| 2007/0109835 A1 | 5/2007 | Hsu |
| 2007/0120124 A1 | 5/2007 | Chen et al. |
| 2007/0121369 A1 | 5/2007 | Happ |
| 2007/0123039 A1 | 5/2007 | Elkins et al. |
| 2007/0132049 A1 | 6/2007 | Stipe |
| 2007/0165434 A1 | 7/2007 | Lee et al. |
| 2007/0167008 A1 | 7/2007 | Hsu et al. |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0267675 A1 | 11/2007 | Cho et al. |
| 2007/0268739 A1 | 11/2007 | Yoo et al. |
| 2007/0268742 A1 | 11/2007 | Liu |
| 2007/0269683 A1 | 11/2007 | Chen et al. |
| 2007/0278578 A1 | 12/2007 | Yoshida et al. |
| 2007/0285965 A1 | 12/2007 | Toda et al. |
| 2007/0295950 A1 | 12/2007 | Cho et al. |
| 2008/0001172 A1 | 1/2008 | Karg et al. |
| 2008/0008642 A1 | 1/2008 | Mori et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0078985 A1 | 4/2008 | Meyer et al. |
| 2008/0080229 A1 | 4/2008 | Choi et al. |
| 2008/0089105 A1 | 4/2008 | Ro et al. |
| 2008/0093591 A1 | 4/2008 | Khang et al. |
| 2008/0099753 A1 | 5/2008 | Song et al. |
| 2008/0102278 A1 | 5/2008 | Kreupl et al. |
| 2008/0105862 A1 | 5/2008 | Lung et al. |
| 2008/0106925 A1 | 5/2008 | Paz de Araujo et al. |
| 2008/0123390 A1 | 5/2008 | Kim et al. |
| 2008/0157257 A1 | 7/2008 | Bertin et al. |
| 2008/0175032 A1 | 7/2008 | Tanaka et al. |
| 2008/0185571 A1 | 8/2008 | Happ et al. |
| 2008/0212361 A1 | 9/2008 | Bertin et al. |
| 2008/0232160 A1 | 9/2008 | Gopalakrishnan |
| 2008/0247219 A1 | 10/2008 | Choi et al. |
| 2008/0251779 A1 | 10/2008 | Kakoschke et al. |
| 2008/0258126 A1 | 10/2008 | Lung |
| 2008/0259672 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kajigaya et al. |
| 2009/0072217 A1 | 3/2009 | Klostermann |
| 2009/0085121 A1 | 4/2009 | Park et al. |
| 2009/0141547 A1 | 6/2009 | Jin et al. |
| 2009/0168495 A1 | 7/2009 | Aoki |
| 2009/0173930 A1 | 7/2009 | Yasuda et al. |
| 2009/0180309 A1 | 7/2009 | Liu |
| 2009/0207647 A1 | 8/2009 | Maejima et al. |
| 2009/0207681 A1 | 8/2009 | Juengling |
| 2009/0218557 A1 | 9/2009 | Sato |
| 2009/0250681 A1 | 10/2009 | Smythe et al. |
| 2009/0261314 A1 | 10/2009 | Kim et al. |
| 2009/0261343 A1 | 10/2009 | Herner et al. |
| 2009/0267047 A1 | 10/2009 | Sasago et al. |
| 2009/0268532 A1 | 10/2009 | DeAmbroggi et al. |
| 2009/0272959 A1 | 11/2009 | Phatak et al. |
| 2009/0272960 A1 | 11/2009 | Srinivasan et al. |
| 2009/0272961 A1 | 11/2009 | Miller et al. |
| 2009/0272962 A1 | 11/2009 | Kumar et al. |
| 2009/0273087 A1 | 11/2009 | French et al. |
| 2009/0278109 A1 | 11/2009 | Phatak |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0316474 A1 | 12/2009 | Cho et al. |
| 2009/0317540 A1 | 12/2009 | Sandhu et al. |
| 2009/0321878 A1 | 12/2009 | Koo et al. |
| 2009/0323385 A1 | 12/2009 | Scheuerlein et al. |
| 2010/0003782 A1 | 1/2010 | Sinha et al. |
| 2010/0008163 A1 | 1/2010 | Liu |
| 2010/0046273 A1 | 2/2010 | Azuma et al. |
| 2010/0065836 A1 | 3/2010 | Lee et al. |
| 2010/0084741 A1 | 4/2010 | Andres et al. |
| 2010/0085798 A1 | 4/2010 | Lu et al. |
| 2010/0090187 A1 | 4/2010 | Ahn et al. |
| 2010/0110759 A1 | 5/2010 | Jin et al. |
| 2010/0123542 A1 | 5/2010 | Vaithyanathan et al. |
| 2010/0135061 A1 | 6/2010 | Li et al. |
| 2010/0140578 A1 | 6/2010 | Tian et al. |
| 2010/0157657 A1 | 6/2010 | Rinerson et al. |
| 2010/0157658 A1 | 6/2010 | Schloss et al. |
| 2010/0163820 A1 | 7/2010 | Son |
| 2010/0163829 A1 | 7/2010 | Wang et al. |
| 2010/0172171 A1 | 7/2010 | Azuma et al. |
| 2010/0178729 A1 | 7/2010 | Yoon et al. |
| 2010/0193758 A1 | 8/2010 | Tian et al. |
| 2010/0193761 A1 | 8/2010 | Amin et al. |
| 2010/0193762 A1 | 8/2010 | Hsieh et al. |
| 2010/0195371 A1 | 8/2010 | Ohba et al. |
| 2010/0232200 A1 | 9/2010 | Shepard |
| 2010/0237442 A1 | 9/2010 | Li et al. |
| 2010/0243983 A1 | 9/2010 | Chiang et al. |
| 2010/0258782 A1 | 10/2010 | Kuse et al. |
| 2010/0259961 A1 | 10/2010 | Fasoli et al. |
| 2010/0259962 A1 | 10/2010 | Yan et al. |
| 2011/0059576 A1 | 3/2011 | Cho et al. |
| 2011/0128775 A1 | 6/2011 | Maejima et al. |
| 2011/0171836 A1 | 7/2011 | Xia |
| 2011/0193044 A1 | 8/2011 | Sandhu et al. |
| 2011/0205783 A1 | 8/2011 | Murooka |
| 2011/0249486 A1 | 10/2011 | Azuma et al. |
| 2011/0261606 A1 | 10/2011 | Sandhu et al. |
| 2011/0261607 A1 | 10/2011 | Tang et al. |
| 2012/0119180 A1 | 5/2012 | Koo et al. |
| 2012/0140542 A1 | 6/2012 | Liu |
| 2012/0164798 A1 | 6/2012 | Sills et al. |
| 2012/0187363 A1 | 7/2012 | Liu et al. |

FOREIGN PATENT DOCUMENTS

| | | |
|---|---|---|
| CN | 1624803 | 6/2005 |
| CN | 101005113 | 12/2006 |
| CN | 101051670 | 4/2007 |
| CN | 101034732 | 9/2007 |
| CN | 10-1546602 | 9/2009 |
| CN | 200880124714.6 | 7/2012 |
| CN | 2011-80027954.6 | 5/2014 |
| EP | 1796103 | 9/2006 |
| EP | 11792836 | 12/2013 |
| JP | 2005175457 | 6/2005 |
| JP | 2005-353779 | 12/2005 |
| JP | 2006032729 | 2/2006 |
| JP | 2006040981 | 2/2006 |
| JP | 2006074028 | 3/2006 |
| JP | 2006121044 | 5/2006 |
| JP | 2008-135744 | 6/2008 |
| JP | 2008-192995 | 8/2008 |
| JP | 2009-081251 | 4/2009 |
| JP | 2009-163867 | 7/2009 |
| JP | 2009-267411 | 11/2009 |

(56) References Cited

FOREIGN PATENT DOCUMENTS

| | | |
|---|---|---|
| JP | 2010-009669 | 1/2010 |
| JP | 2010-010688 | 1/2010 |
| JP | 2010-232214 | 10/2010 |
| JP | 2010-263211 | 11/2010 |
| KR | 2005-0008353 | 1/2005 |
| KR | 1020060087882 | 8/2006 |
| KR | 10-0751736 | 8/2007 |
| KR | 20070111840 | 11/2007 |
| KR | 20070118865 | 12/2007 |
| KR | 20090109804 | 10/2009 |
| KR | 20100078808 | 7/2010 |
| KR | 20100083402 | 7/2010 |
| TW | 097147549 | 5/2003 |
| TW | 100119681 | 8/2013 |
| TW | 100135681 | 10/2013 |
| TW | 100142963 | 8/2014 |
| TW | 101102280 | 8/2014 |
| WO | WO 2006/003620 | 1/2006 |
| WO | WO 2008/029446 | 3/2008 |
| WO | PCT/US2008/084422 | 3/2009 |
| WO | WO 2009/127187 | 10/2009 |
| WO | WO 2010/068221 | 6/2010 |
| WO | PCT/US2008/084422 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | 2010/117911 | 10/2010 |
| WO | PCT/US11/035601 | 11/2011 |
| WO | PCT/US2011/051785 | 4/2012 |
| WO | PCT/US2011/059095 | 5/2012 |
| WO | PCT/US12/021166 | 7/2012 |
| WO | PCT/US2011/066770 | 9/2012 |
| WO | PCT/US11/035601 | 12/2012 |
| WO | PCT/US2011/051785 | 4/2013 |
| WO | PCT/US2011/059095 | 6/2013 |
| WO | PCT/US2011/066770 | 7/2013 |

OTHER PUBLICATIONS

Wikipedia, "Programmable metallization cell", Downloaded from http://en.wikipedia.org/wiki/Programmable_metallization_cell on Aug. 24, 2010.
U.S. Appl. No. 12/701,885, filed Feb. 8, 2010, Sandhu et al.
U.S. Appl. No. 12/765,598, filed Apr. 22, 2010, Sandhu et al.
U.S. Appl. No. 12/959,015, filed Dec. 2, 2010, Liu.
U.S. Appl. No. 12/979,189, filed Dec. 27, 2010, Sills et al.
U.S. Appl. No. 13/010,048, filed Jan. 20, 2011, Liu et al.
U.S. Appl. No. 12/014,232, filed Jan. 15, 2008, Liu.
U.S. Appl. No. 12/099,267, filed Apr. 8, 2008, Smythe et al.
U.S. Appl. No. 12/114,096, filed May 2, 2008, Srinivasan et al.
U.S. Appl. No. 12/141,368, filed Jun. 18, 2008, Liu.
U.S. Appl. No. 12/141,559, filed Jun. 18, 2008, Sandhu et al.
U.S. Appl. No. 12/166,604, filed Jul. 2, 2008, Sinha et al.
U.S. Appl. No. 12/765,506, filed Apr. 22, 2010, Tang et al.
Baek et al., "Multi-Layer cross-point Binary Oxide resistive Memory (OxRRAM) for Post-NAND Storage Application", IEEE, 2005.
Bedeschi et al., "A Bipolar-Selected Phase Change Memory Featuring Multi-Level Cell Storage", IEEE, vol. 44, No. 1, Jan. 2009, pp. 217-227.
Chen et al., "Non-Volatile Resistive Switching for Advanced Memory Applications", IEEE, 2005, 4 pages.
Chen et al., Peroskite RRAM Devices with Metal/Insulator/PCMO/Metal Heterostructures, 2005; pp. 125-128.
Choi et al., "Defect Structure and Electrical Properties of single-Crystal Ba0.03SR0,97TIO3"; J. Am Ceram. Soc., 71, [4], pp. 201-205, 1988.
Courtade et al., "Microstructure and resistance switching in NiO binary oxide films obtained from Ni oxidation", IEEE, 2006, pp. 94-99.
Higaki et al.; Effects of Gas Phase Absorption into Si Substrates on Plasma doping Process; Jan. 2004; A208.
Ho et al., "A Highly Reliable Self-=Aligned Graded Oxide WOx Resistance Memory: Conduction Mechanisms and Reliability", 2007 Symposium on VLSI Technology Digest of Technical Papers, pp. 228-229.
Hosoi et al., "High Speed Unipolar Switching Resistance RAM (RRAM) Technology", Advanced Materials Res. Lab, Japan; Correlated Electron Res. Center (CERC), Japan; Nanotechnology Res. Inst. (NRI), Japan, Dec. 2006; 4 pp.
Hudgens et al., "Overview of Phase-Change Chalcogenide Nonvolatile Memory Technology", MRS Bulletin, Nov. 2004, pp. 829-832.
Ignatiev et al., "Resistance Non-volatile Memory-RRAM", Mater. Res. Soc. Symp. Proc., vol. 997, 2007, Materials Research Society, 9 pages.
Karg et al., "Nanoscale REsistive Memory Device using SrRiO3 Films", IEEE, 2007, pp. 68-70.
Kau et al., "A Stackable cross point phase charge memory", IEEE, 2009, pp. 27.1.1-27.1.4.
Komori et al., Disturbless flash memory due to high boost efficiency on BiCS structure and optimal memory film stack for ultra high density storage device; Dec. 2008; pp. 851-854.
Kooij et al., "Photoselective Metal Deposition on Amorphous Silicon p-i-n Solar Cells", Electrochemical Society Letters, Journal of Electrochemical Society vol. 44, No. 10, Oct. 1997, pp. L271-272.
Kozicki, "Memory Devices Based on Solid Electrolytes", Mater Res. Soc. Symp. Proc., vol. 997, 2007, Materials Research Society, 10 pages.
Lee et al., "2-stack 1D-1R Cross-Point Structure with Oxide Diodes as Switch Elements for High Density Resistance RAM Applications", IEE, 2007, pp. 771-774.
Lee et al., "Resistance Switching of Al doped ZnO for Non-Volatile Memory Applications", Dept. of Materials Science and Engineering, Gwangju Institute of Science and Technology, May 2006; 2 pp.
Lin et al., "Effect of Top Electrode Material on REsistive Switching Properties of ZrO2 Film Memory Devices", IEEE, May 2007, vol. 28, No. 5, pp. 366-368.
Meyer et al., "Oxide Dual-Layer Memory Element for Scalable Non-Volatile Cross-Point Memory Technology", IEEE, 2008, 5 pages.
Miyashita et al., "A Novel Bit-Line Process using Poly-Si Masked Dual Damascene (PMDD) for 0.13um DRAMs and Beyond", IEEE, 2000, pp. 15.4.1-15.4.4.
Muller et al., "Emerging Non-Volatile Memory Technologies", IEEE, 2003, pp. 37-44.
Oh, "Full Integration of Highly Manufacturable 512Mb PRAM based on 90nm Technology" 2006, IEEE, 4 pages.
Pein et al., "Performance of the 3-D Pencil Flash EPROM Cell and Memory Array" IEEE, 1995, pp. 1982-1991.
Pellizzer et al., "A 90nm Phase Change Memory Technology for Stand-Alone Non-Volatile Memory Applications", IEEE, 2006, Symposium on VLSI Technology Digest of Technical Papers, 2 pages.
Pirovano et al., "Self-Aligned u Trench Phase-Change Memory Cell Architecture for 90nm Technology and Beyond", IEEE, 2007, pp. 222-225.
Programmable metallization cell, Dec. 11, 2007; http://en.wikipedia.org/wiki/Programmable_metallization_cell on Dec. 13, 2011.
Scheck et al., "Selective Metal Electrodeposition Through Doping Modulation of Semiconductor Surfaces", Applied Physics Letters 86, 2005, 3 pgs.
Wuttig, "Towards a Universal Memory?", Nature Memory, vol. 4, Apr. 2005, pp. 265-266.
Xing et al., "Characterization of AlGaN/GaN p-n Diodes with Selectively Regrown n-AlGaN by Metal-Organic Chemical-Vapor Deposition and its Application to GaN-Based Bipolar Transistors", Journal of Allpied Physics 97, 2005, 4 pgs.
Yih et al., "SIC/Si Heterojunction Diodes Fabricated by Self-Selective and by Blanket Rapid Thermal Chemical Vapor Deposition", IEEE vol. 41 No. 3, Mar. 1994, pp. 281-287.
Yoon et al., "Vertical Cross-Point Resistance Change Memory for Ultra-High Density Non-volatile Memory Applications", 2009 Symposium on VLSI Technology Digest of Technical Papers, pp. 26-27.
Yu et al., "Structure Effects on Resistive Switching of Al/TiOx/Al Devices for RRAM Applications" IEEE, 2008, pp. 331-333.

ELECTRONIC DEVICES, MEMORY DEVICES AND MEMORY ARRAYS

RELATED PATENT DATA

This patent resulted from a continuation of U.S. patent application Ser. No. 12/893,992, which was filed Sep. 29, 2010, which issued as U.S. Pat. No. 8,351,242, and which is hereby incorporated herein by reference.

TECHNICAL FIELD

Electronic devices, memory devices and memory arrays.

BACKGROUND

Memory is one type of integrated circuitry, and is used in computer systems for storing data. Such is usually fabricated in one or more arrays of individual memory cells. The memory cells might be volatile, semi-volatile, or nonvolatile. Nonvolatile memory cells can store data for extended periods of time, and in many instances including when the computer is turned off. Volatile memory dissipates and therefore requires to be refreshed/rewritten, in many instances including multiple times per second. Regardless, the smallest unit in each array is termed as a memory cell and is configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. There is a continuing effort to reduce the number of components in individual devices because such can reduce the size of finished constructions, and can simplify processing. The smallest and simplest memory cell will likely be comprised of two current conductive electrodes having a programmable material received between them.

Suitable programmable materials have two or more selectable resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells. Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two conductive electrodes having a programmable material received therebetween. The programmable material is selected or designed to be configured in a selected one of at least two different resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells.

An example memory device is a programmable metallization cell (PMC). Such may be alternatively referred to as a conductive bridging RAM (CBRAM), nanobridge memory, or electrolyte memory. A PMC uses ion conductive material (for instance, a suitable chalcogenide or any of various suitable oxides) sandwiched between a pair of current conductive electrodes. A suitable voltage applied across the electrodes generates current conductive super-ionic clusters or conducting filaments. Such result from ion transport through the ion conductive material which grows the clusters/filaments from one of the electrodes (the cathode), through the ion conductive material, and toward the other electrode (the anode). The clusters or filaments create current conductive paths between the electrodes. An opposite voltage applied across electrodes essentially reverses the process and thus removes the conductive paths. A PMC thus comprises a high resistance state (corresponding to the state lacking a conductive filament or clusters between the electrodes) and a low resistance state (corresponding to the state having a conductive filament or clusters between the electrodes), with such states being reversibly interchangeable with one another.

Although there has been some effort toward development of PMC-based memory cells, there remains a need for improved memory cells. Accordingly, it would be desirable to develop new memory cells, and new architectures which incorporate such memory cells into integrated circuitry.

DETAILED DESCRIPTION OF THE ILLUSTRATED EMBODIMENTS

In some embodiments the invention includes novel memory cells incorporating PMC-type structures, and novel memory arrays utilizing such memory cells. Prior to discussing specific memory cells of example embodiments, the operation of a PMC device will be described.

Figure 1:
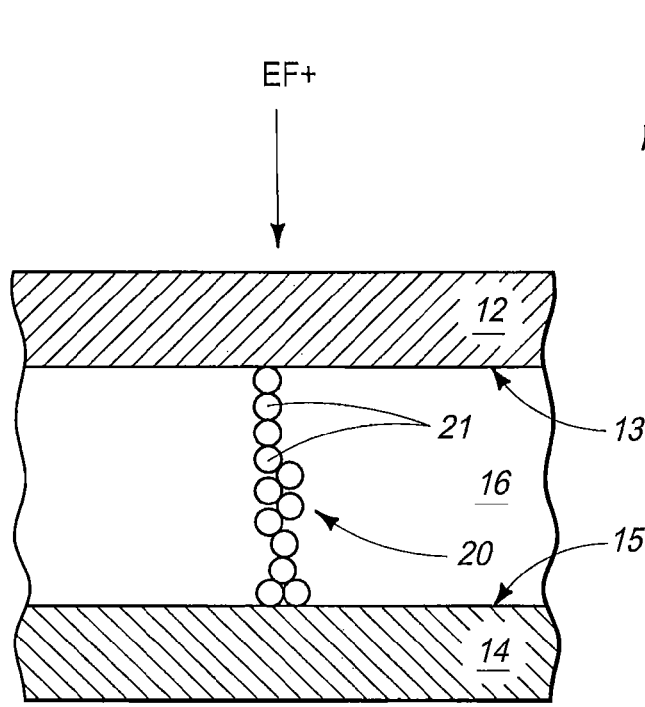
FIGS. 1 and 2 are a diagrammatic view of a PMC in a low resistance state, and a diagrammatic view of the PMC in a high resistance state, respectively.
Figure 2:
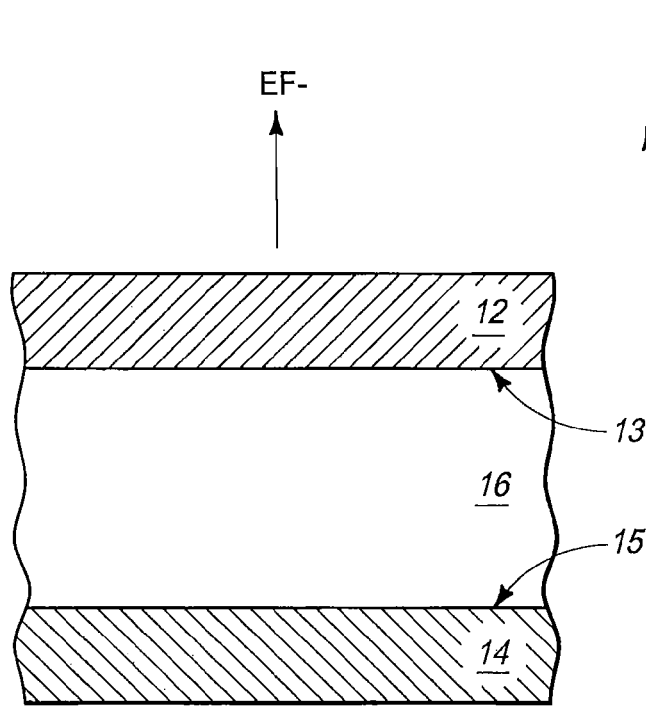

FIGS. 1 and 2 diagrammatically illustrate a PMC device 10 in both a low resistance state (FIG. 1) and a high resistance state (FIG. 2).

FIG. 1 shows the PMC device 10 to comprise ion conductive material 16 (which may be referred to as an electrolyte in some embodiments) between a pair of current conductive electrodes 12 and 14. The electrode 12 comprises a surface 13 which is electrochemically active, while the electrode 14 comprises a surface 15 which is electrochemically inactive.

Electrodes 12 and 14 may comprise any suitable current conductive material, and may be homogenous or non-homogenous. In the context of this document, "current conductive material" is a composition where electric current flow would inherently occur therein predominantly by movement of subatomic positive and/or negative charges when such are generated as opposed to predominantly by movement of ions. At least one of the electrodes 12 and 14 has an electrochemically active surface received directly against ion conductive material 16. By way of examples only, suitable current conductive and electrochemically active materials include copper, silver, and alloys including at least one of copper and silver. Example suitable current conductive and electrochemically inactive materials include titanium nitride, gold, tungsten, platinum, and alloys including at least one of gold, tungsten or platinum.

Ion conductive material 16 may be a solid, gel, or any other suitable phase, and may comprise any suitable composition. In some embodiments the ion conductive material may comprise, consist essentially of, or consist of chalcogenide-type material (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and CuTe) and/or oxides such as zirconium oxide, hafnium oxide, tungsten oxide, silicon oxide (specifically, silicon dioxide), gadolinium oxide, etc. The ion conductive material may have silver ions or other suitable ions diffused therein for ionic conduction, analogously to structures disclosed in U.S. Pat. No. 7,405,967 and U.S. Patent Publication Number 2010/0193758.

Application of electric field (EF+) across the PMC device 10 forms a current conducting filament 20 of ionic particles 21. The individual ionic particles may be super-ionic clusters, and/or may be individual ions. The filament 20 extends between the electrodes 12 and 14, and thus provides a low-resistance current conduction path through the ion conductive material 16 within the PMC device 10. The device 10 having filament 20 therein may be considered to be in a low-resistance state. The conductive path formed by the particles 21 may comprise the particles directly contacting one another (as shown), or may comprise small gaps between some of the particles.

FIG. 2 shows device 10 as an electric field (EF−) is applied to the device. The electric field (EF−) is of opposite polarity relative to the field (EF+) of FIG. 1, and causes ions to move back to the active surface 13 electrode 12—thereby dissipating the filament 20 (FIG. 1). Accordingly, the low-resistance path provided by such filament is removed, and the device 10 is transitioned into a high-resistance state.

Figure 3:
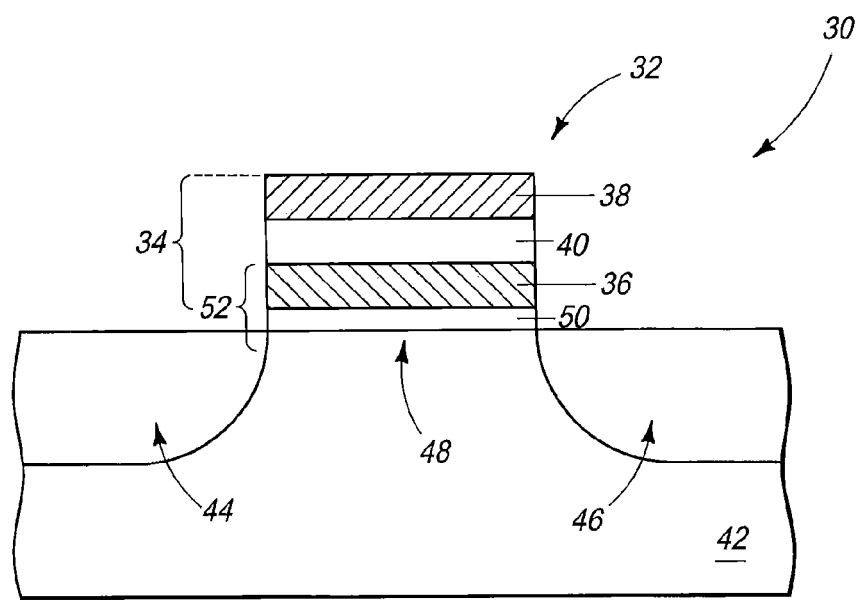
FIG. 3 is a diagrammatic cross-sectional view of a portion of a semiconductor construction illustrating an example embodiment memory cell.

FIG. 3 shows a construction 30 having an example embodiment memory cell 32 that incorporates a region having PMC-type characteristics. Specifically, the memory cell 32 has a PMC-type region 34 comprising a first electrode 36, a second electrode 38, and an ion conductive material 40 between the first and second electrodes. At least one of the first and second electrodes may comprise an electrolytically active surface directly against the ion conductive material 40.

The memory cell 32 is supported by a semiconductor base 42. The semiconductor base may comprise any suitable composition or combination of compositions, and in some embodiments may comprise, consist essentially of, or consist of monocrystalline silicon lightly background doped with appropriate p-type dopant. The semiconductor base may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 42 is shown to be homogenous, the base may comprise numerous layers in some embodiments. For instance, base 42 may correspond to a semiconductor substrate containing one or more layers associated with integrated circuit fabrication. In such embodiments, such layers may correspond to one or more of refractory metal layers, barrier layers, diffusion layers, insulator layers, etc.

A pair of source/drain regions 44 and 46 extend into semiconductor base 42. The source/drain regions may be doped with any suitable dopant, and in some embodiments may be heavily doped with n-type dopant.

A channel region 48 is directly between the source/drain regions 44 and 46. The channel region may be doped with any suitable dopant, and in some embodiments may be threshold-voltage doped.

Dielectric 50 is directly over the channel region 48, and the electrode 36 is directly over the dielectric. The electrode 36 is thus spaced from the channel region by the dielectric 50. Dielectric 50 may comprise any suitable composition or combination of compositions. In some embodiments the dielectric 50 may consist of oxide (i.e., may be a dielectric oxide) and may comprise one or more of silicon dioxide, hafnium oxide, zirconium oxide, etc.

The electrode 36, dielectric 50 and underlying channel region 48 together form a capacitor 52. In some embodiments the PMC-type region 34 may be considered a first capacitor, and the capacitor 52 may be considered a second capacitor which is serially connected to the first capacitor, and which shares a common electrode (36) with the first capacitor.

The memory cell 32 comprising the two serially-connected capacitors 34 and 52 may be a nonvolatile memory cell.

The memory cell 32 may be constructed so that one of the electrodes 36 and 38 comprises an electrochemically active surface directly against ion conductive material 40, while the other electrode comprises an electrochemically inactive surface directly against the ion conductive material. The electrochemically active surface is a surface which donates ions to form a filament analogous to the filament 20 of FIG. 1, and the electrochemically inactive surface comprises a material which is incapable of donating such ions. For instance, in embodiments in which the filament will comprise one or both of silver ions and copper ions, the electrochemically active surface may comprise one or both of silver and copper while the electrochemically inactive surface does not comprise either silver or copper. In some embodiments the electrochemically inactive surface may comprise, consist essentially of, or consist of titanium nitride, gold, palladium, platinum, etc.

A problem that may occur in embodiments in which the bottom electrode 36 comprises electrochemically active material is that ions may diffuse from such electrode into dielectric 50. The dielectric 50 may then function as ion conductive material if sufficient voltage is applied across capacitor 52, which can result in formation of a filament (analogous to the filament 20 of FIG. 1) forming across the dielectric 50 to short electrode 36 to the channel region 48. Accordingly, in some embodiments it can be preferred that the upper electrode 38 comprise electrochemically active material, and that the bottom electrode 36 comprise electrochemically inactive material. However, the problem of filament formation across dielectric 50 may be avoided even if the bottom electrode comprises electrochemically active material. For instance, the voltage across capacitor 52 may be kept at levels too low for filament formation. As another example, electrode 36 may be formed of two or more different layers with the upper layer (i.e., the layer which is directly against ion conductive material 40) being electrochemically active material and the lower layer (i.e., the layer which is directly against dielectric 50) being electrochemically inactive material and/or being a barrier to diffusion of ions from the upper layer into the underlying dielectric.

The electrodes 36 and 38 may be of any suitable thickness, and in some embodiments may have thicknesses of from about 5 Å to about 500 Å. The electrodes 36 and 38 may be about the same thickness as one another (as shown), or may be different thicknesses relative to one another. The dielectric 50 and ion conductive material 40 may be of any suitable thicknesses. In some embodiments the dielectric 50 and ion conductive material 40 may have thicknesses of from about 10 Å to about 200 Å, and in some embodiments may have thicknesses of from about 15 Å to about 50 Å. The dielectric 50 and ion conductive material 40 may be about the same thickness as one another, or may be of different thicknesses relative to one another. The relative capacitances of capacitors 34 and 52 may be tailored by, for example, adjusting the thicknesses and compositions of dielectric 50 and ion conductive material 40, adjusting the compositions of electrodes 36 and 38, and/or adjusting the relative doping type and concentration within the channel region 48.

In operation, memory cell 32 may adopt one of two different memory states based upon whether or not a filament (for instance, a filament analogous to the filament 20 of FIGS. 1 and 2) extends across material 40 to electrically interconnect electrodes 36 and 38 to one another. Specifically, if the memory cell 32 is in a state lacking such filament it will have a lower capacitance and a higher threshold voltage than if the memory cell 32 is in a state having the filament. Accordingly, the memory cell may be programmed by inducing either the memory state having the filament, or the memory state lacking the filament; and may be read by determining the capacitance and/or the threshold voltage of the cell to ascertain which of the memory states the cell is in.

Figure 4:
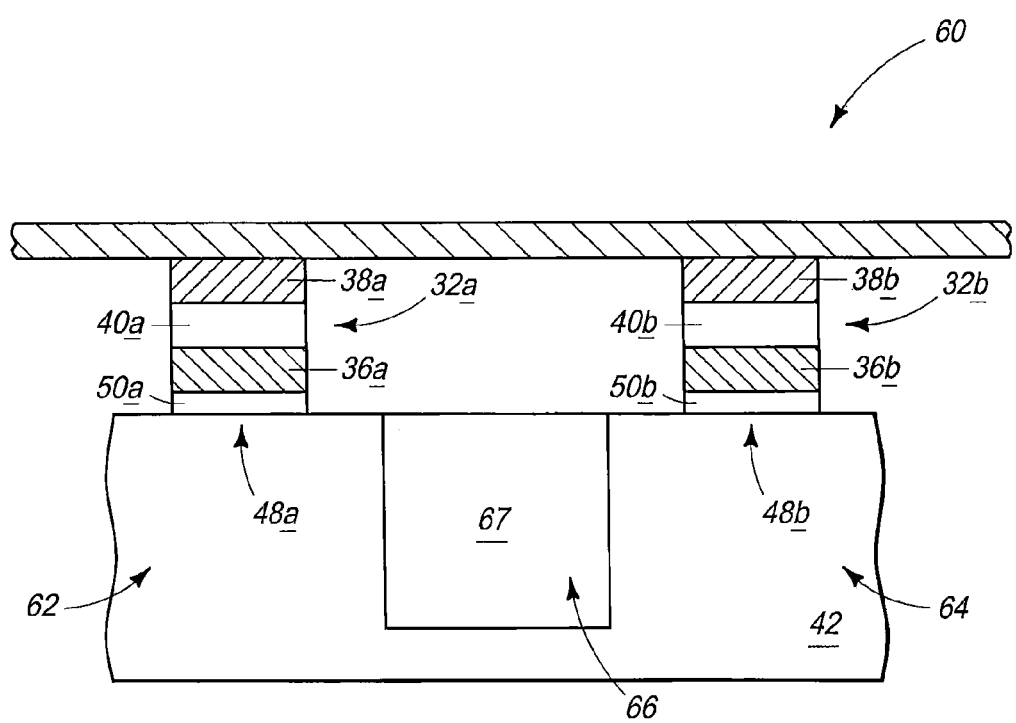
FIGS. 4 and 5 are a diagrammatic cross-sectional view and a diagrammatic three-dimensional view, respectively, of a portion of an example embodiment memory array.
Figure 5:
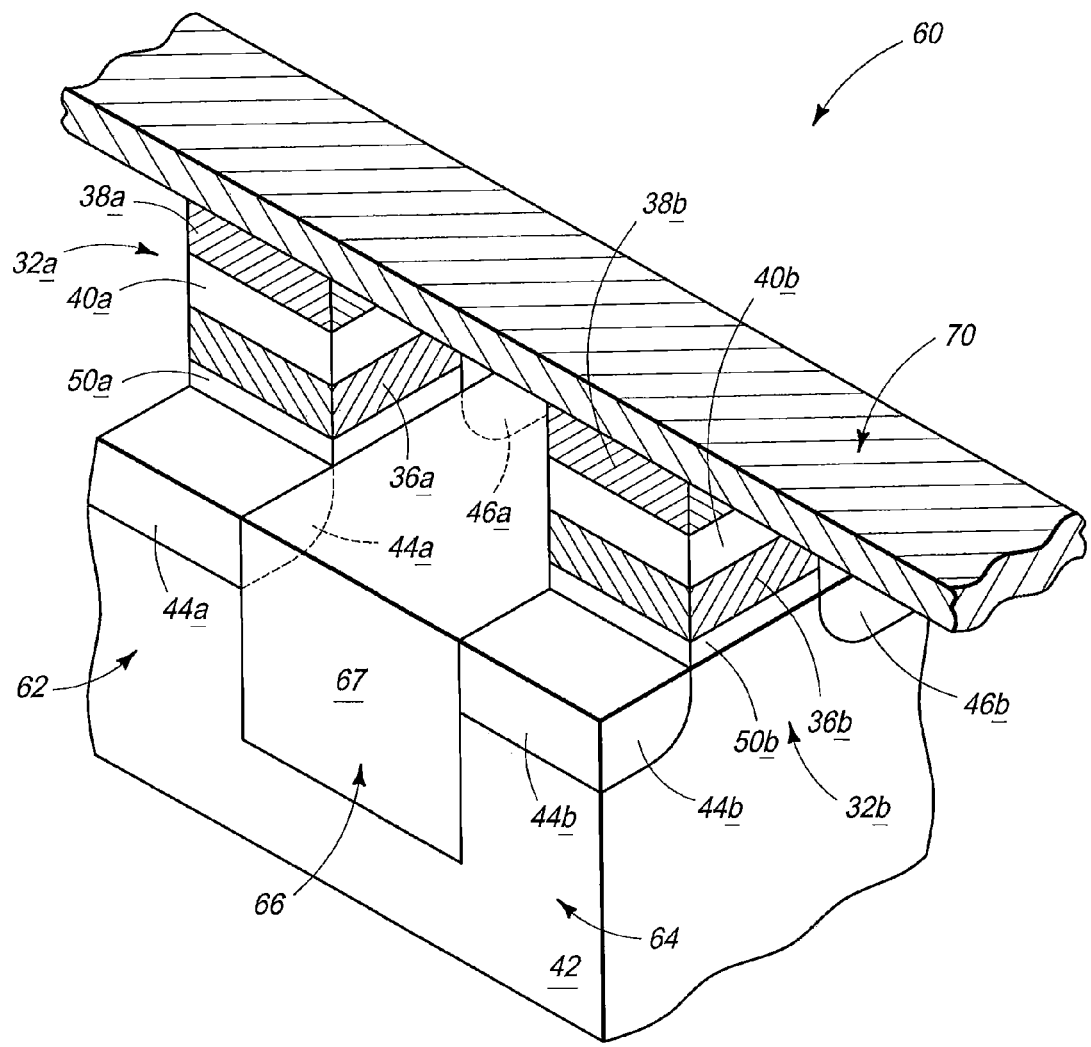

In some embodiments a plurality of memory cells of the type shown in FIG. 3 as cell 32 are incorporated into a memory array. FIGS. 4 and 5 are a diagrammatic cross-sectional view and a three-dimensional view, respectively, of a portion of a construction 60 illustrating a segment of an example embodiment memory array.

The semiconductor substrate 42 is subdivided into a plurality of active regions (with two of the active regions being shown as 62 and 64 in FIGS. 4 and 5) separated from one another by intervening dielectric regions (with an intervening dielectric region being shown as 66 in FIGS. 4 and 5). The intervening dielectric regions contain dielectric material 67. Such dielectric material may comprise any suitable composition or combination of compositions, and in some embodiments may comprise, consist essentially of, or consist of one or both of silicon dioxide and silicon nitride.

The paired source/drain regions 44 and 46 are within the individual active regions; and in the shown embodiment of FIG. 5 paired source/drain regions 44a and 46a are within active region 62, while paired source/drain regions 44b and 46b are within active region 64.

Memory cells 32a and 32b are associated with the active regions 62 and 64, respectively. The memory cells comprise the same components discussed above with reference to FIG. 3. Specifically, memory cell 32a comprises dielectric 50a, first electrode 36a, ion conductive material 40a and second electrode 38a; and similarly memory cell 32b comprises dielectric 50b, first electrode 36b, ion conductive material 40b and second electrode 38b.

An electrically conductive data/sense line 70 (for instance, a bitline or a wordline) extends across the memory cells 32a and 32b. Such line may comprise any suitable electrically conductive composition or combination of compositions; and in some embodiments may comprise, consist essentially of, or consist of one or more of various metals, metal-containing compositions, and conductively-doped semiconductor materials. In some embodiments the shown memory cells may be part of a two-dimensional array comprising rows and columns, and the data/sense line 70 may be considered to interconnect memory cells that are along a common row with one another. Other interconnects may be utilized for connecting memory cells along a common column as one another, and such other interconnects may electrically connect with various of the source/drain regions of the memory cells. The data/sense lines 70 may be considered to be comprised by a first series of interconnects that extend along rows of a memory array, and other interconnects (not shown) may form a second series that extends along columns of the memory array. Each individual memory cell may be uniquely addressed through the combination of one interconnect from the first series, and another interconnect from the second series.

The memory array of FIGS. 4 and 5 shows the ion conductive material 40 patterned into a plurality of spaced-apart features (specifically, features 40a and 40b), with each feature being unique to a memory cell; and similarly shows atop electrode material patterned into a plurality of separate features (specifically, electrodes 38a and 38b) unique to individual memory cells. In some embodiments one or both of the ion conductive material and the top electrode material may be comprised by an expanse that extends across multiple memory cells.

Figure 6:
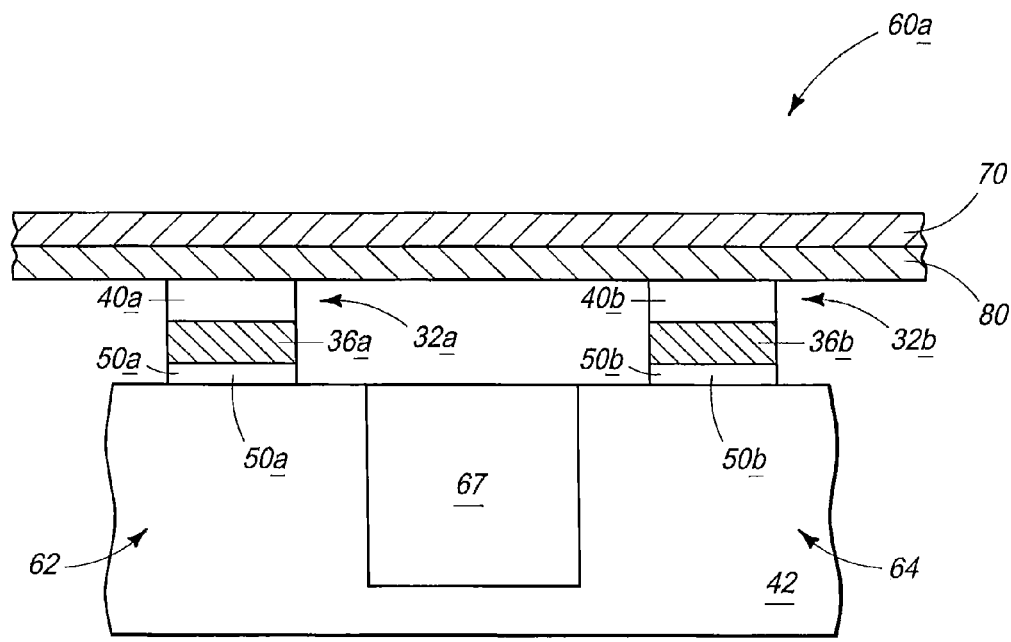
FIG. 6 is a diagrammatic cross-sectional view of a portion of another example embodiment memory array.

FIG. 6 shows a portion of a construction 60a illustrating a segment of an example embodiment memory array in which top electrodes 38a and 38b are replaced by an expanse of top electrode material 80 that extends across multiple memory cells. In some embodiments analogous to that of FIG. 6, the data line 70 may be omitted and instead the top electrode material 80 may be used as both a data line as a top electrode material.

Figure 7:
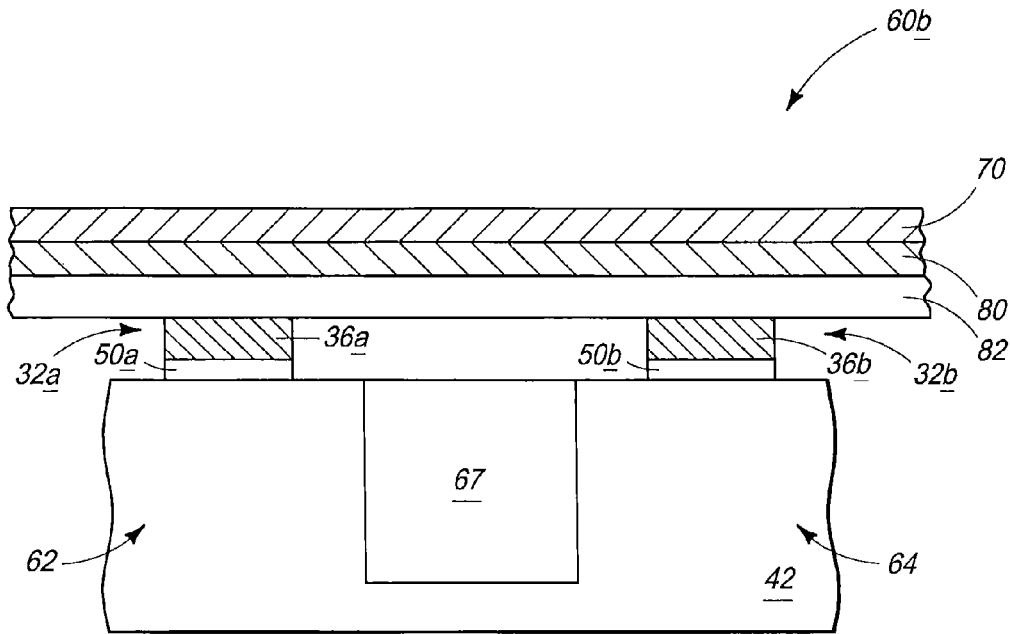
FIG. 7 is a diagrammatic cross-sectional view of a portion of another example embodiment memory array.

FIG. 7 shows a portion of a construction 60b illustrating a segment of an example embodiment memory array in which top electrodes 38a and 38b are replaced by an expanse of top electrode material 80 that extends across multiple memory cells; and in which ion conductive material features 40a and 40b are replaced by an expanse of ion conductive material 82 that extends across multiple memory cells. In some embodiments analogous to that of FIG. 7, the data line 70 may be omitted and instead the top electrode material 80 may be used as both a data line as a top electrode material. The ion conductive material 82 may extend across a plurality of memory cells in the same row as one another (as shown) and/or may extend across memory cells in the same column as one another.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory device, comprising:
    a first electrode spaced from an underlying semiconductor substrate by dielectric;
    a second electrode over the first electrode, and spaced from the first electrode by ion conductive material; the ion conductive material comprising one or more compositions selected from the group consisting of chalcogenides and oxides;
    a pair of source/drain regions extending into the semiconductor substrate adjacent the first electrode, one of the source/drain regions being along one side of the first electrode and the other of the source/drain regions being along another side of the first electrode; and
    wherein at least one of the first and second electrodes has an electrochemically active surface directly against the ion conductive material.

2. The device of claim 1 wherein the first electrode has the electrochemically active surface directly against the ion conductive material.

3. The device of claim 2 wherein the second electrode has an electrochemically inactive surface directly against the ion conductive material.

4. The device of claim 1 wherein the second electrode has the electrochemically active surface directly against the ion conductive material.

5. The device of claim 4 wherein the first electrode has an electrochemically inactive surface directly against the ion conductive material.

6. An electronic device comprising two capacitors connected in series and sharing a common electrode; one of said capacitors comprising a region of a monocrystalline silicon substrate, with said region being spaced from the common electrode by dielectric; the other of said capacitors comprising a second electrode over the first electrode, with said second electrode being spaced from the first electrode by ion conductive material; wherein at least one of the first and second electrodes has an electrochemically active surface directly against the ion conductive material; and wherein the ion conductive material comprises silver.

7. The device of claim 6 wherein the region of the monocrystalline silicon substrate is a channel region which is directly between a pair of source/drain regions.

8. A memory array, comprising:
    a plurality of active regions within a semiconductor substrate, the active regions being spaced from one another by intervening dielectric regions; the active regions comprising channel regions of memory cells;
    a plurality of spaced apart first electrodes over the semiconductor substrate, each first electrode being directly over a channel region and being spaced from such channel region by dielectric;
    ion conductive material over the first electrodes;
    second electrode material over the ion conductive material; and
    wherein the second electrode material has an electrochemically active surface directly against the ion conductive material.

9. The memory array of claim 8 wherein the ion conductive material is an expanse extending across a plurality of the memory cells.

10. The memory array of claim 8 wherein the ion conductive material is a plurality of spaced apart features, with each feature being comprised by only one of the memory cells.

11. The memory array of claim 8 wherein the second electrode material is an expanse extending across a plurality of the memory cells.

12. The memory array of claim 8 wherein the dielectric comprises one or more oxides; and wherein the ion conductive material comprises one or more compositions selected from the group consisting of chalcogenides and oxides.

* * * * *